(12) United States Patent
Nakai et al.

(10) Patent No.: US 7,439,554 B2
(45) Date of Patent: Oct. 21, 2008

(54) SEMICONDUCTOR DEVICE AND METHOD FOR FABRICATING THE SAME

(75) Inventors: Junichi Nakai, Fukuyama (JP); Tetsuro Aoki, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 403 days.

(21) Appl. No.: 11/006,509

(22) Filed: Dec. 6, 2004

(65) Prior Publication Data

US 2005/0179103 A1 Aug. 18, 2005

(30) Foreign Application Priority Data

Dec. 5, 2003 (JP) .............................. 2003-408340

(51) Int. Cl.
*H01L 29/18* (2006.01)
(52) U.S. Cl. ....................................... 257/184; 257/431
(58) Field of Classification Search ................. 257/184, 257/431

See application file for complete search history.

(56) References Cited

U.S. PATENT DOCUMENTS 5,166,784 A * 11/1992 Suda et al. ................... 358/500

| 5,796,154 A | 8/1998 | Sano et al. |
| 6,030,852 A | 2/2000 | Sano et al. |
| 6,504,188 B1 * | 1/2003 | Maruyama et al. .......... 257/222 |
| 6,903,395 B2 | 6/2005 | Nakai et al. |

FOREIGN PATENT DOCUMENTS

| JP | 08-316448 | 11/1996 |
| JP | 11-040787 | 2/1999 |
| JP | 11-103037 | 4/1999 |
| JP | 2000-180621 | 6/2000 |
| JP | 2001-060678 | 3/2001 |
| JP | 2003-229553 | 8/2003 |
| JP | 2004-079932 | 3/2004 |
| WO | WO 02/27360 | 4/2002 |

* cited by examiner

*Primary Examiner*—Douglas M Menz
(74) *Attorney, Agent, or Firm*—Edwards Angell Palmer & Dodge LLP; David G. Conlin; George W. Neuner

(57) ABSTRACT

A semiconductor device comprises a photoelectric conversion portion formed on a semiconductor substrate, a first transparent film provided on the photoelectric conversion portion, and an interlayer lens provided on the first transparent film at a position corresponding to the photoelectric conversion portion, in which the interlayer lens has a higher refractive index than the first transparent film, and at least one of upper and lower surfaces of a second transparent film formed with a thin film multilayer structure of two or more types of compounds is formed to have a protruded shape.

7 Claims, 9 Drawing Sheets

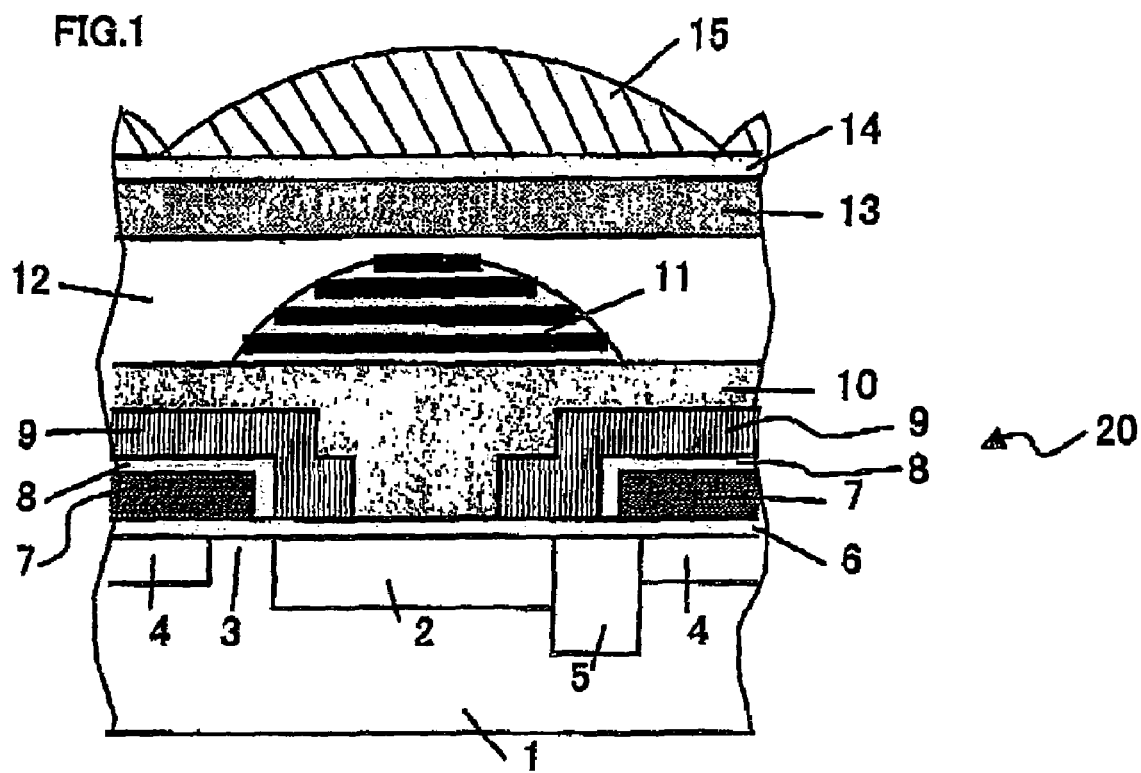

*Prior Art*

*Prior Art*

SEMICONDUCTOR DEVICE AND METHOD FOR FABRICATING THE SAME

This Nonprovisional application claims priority under 35 U.S.C. §119(a) on Patent Application No. 2003-408340 filed in Japan on Dec. 5, 2003, the entire contents of which are hereby incorporated by reference.

BACKGROUND OF THE INVENTION

1. Field of the Invention

The present invention relates to a semiconductor device, such as a solid-state image sensing device which is used in an image input device such as a camera and has an interlayer lens at a position corresponding to a photoelectric conversion portion, and a method for fabricating the same.

2. Description of the Related Art

Such a solid-state image sensing device includes, for example, a charge coupled device image sensor (hereinafter, simply referred to as CCD), a complementary metal oxide semiconductor (CMOS) image sensor, and the like. These types of solid-state image sensing devices are used in various applications, for example, a digital camera, a video camera, a mobile telephone with an integrated camera, a scanner, a facsimile, and the like. As a device using such a solid-state image sensing device is becoming more widely used, there is a stronger demand not only in improving the function and performance, for example, increasing the number of pixels, enhancing light receiving sensitivity, but also in miniaturizing the device and reducing the cost.

As a solid-state image sensing device is becoming smaller and the number of pixels is increasing while the cost is kept low, the size of each of the pixels is becoming smaller and smaller. As the pixel size decreases, the light receiving sensitivity, one of the basic properties of the solid-state image sensing device, deteriorates. Thus, it is difficult to acquire a picture of a vivid image with a low illuminance. Therefore, how to improve the light receiving sensitivity per unit pixel is an important challenge to be tackled.

As a method for improving the light receiving sensitivity of a solid-state image sensing device, Japanese Publication for Opposition No. 2945440 discloses a method for forming a microlens on a color filter from an organic high polymer material. Further, Japanese Laid-Open Publication No. 11-40787 discloses a method for forming a so-called interlayer lens inside a laminate structure below a color filter and between a light-receiving portion and the color filter as shown in FIG. 4.

As shown in FIG. 4, a conventional solid-state image sensing device includes a photoelectric conversion portion (light receiving portion) 22, a read out gate portion 23, a CCD transfer channel 24, and a channel stopper 25, which together form a pixel, on a surface of a semiconductor substrate 21.

A transfer electrode 27 is formed on the CCD transfer channel 24 via an insulation film 26. A light shielding film 29 is formed on the transfer electrode 27 via an interlayer insulation film 28. A first flattening film 30 formed of boro-phospho-silicate glass (BPSG) and the like, and an interlayer lens 31 formed of a silicon nitride film and the like are formed on the light shielding film 29. Then, a surface is flattened by a second flattening film 32. A color filter 33 which is a combination of red green and blue (R, G, and B) is formed on the second flattening film 32. A microlens 35 is formed on the color filter 33 via a protection film 34 so as to be located above the photoelectric conversion portion 22.

As another method for improving the light receiving sensitivity of a solid-state image sensing device, Japanese Laid-Open Publication No. 2001-60678 discloses a microlens having a variable refractive index which utilizes a characteristic that the refractive index varies depending on a voltage applied (pockelse effect).

When a solid-state image sensing device is integrated in a video camera, the f-number of a lens provided at the video camera side varies to have the appropriate exposure depending on the lighting conditions. Thus, light incident on the solid-state image sensing device through the lens of the video camera has an angle varied by a diaphragm of the lens of the video camera. The light incident on the solid-state image sensing device is not only collimated light but also diagonal light. Therefore, electrodes are provided on and under the microlens or an interlayer microlens so that the incident light is always received at a photoelectric conversion portion in accordance with the diaphragm of the lens of the video camera. The refractive index of the microlens or interlayer microlens is made to be flexibly changed by applying a voltage to the microlens or interlayer microlens. In this example, the material used for the microlens or interlayer microlens is a refractive-index variable layer formed of electrooptic ceramics (for example, PLZT, $LiNbO_3$). PLZT is a piezoelectric material which is lead titanate-lead zirconate solid solution ($PbTiO_3$-$PbZrO_3$) in which a part of Pb is substituted with La.

Hereinafter, a generally known method for forming an interlayer lens 31 will be described.

First, as shown in FIG. 5A, predetermined impurity ions are injected into a semiconductor substrate 21 to form a photoelectric conversion portion 22, a read out gate portion 23, a CCD transfer channel 24, and a channel stopper 25.

Then, an insulation film 26 is formed on a surface of the semiconductor substrate 21. A transfer electrode 27 having a predetermined pattern is formed on the insulation film 26 to a film thickness of 300 nm. A light shielding film 29 is formed on the transfer electrode 27 via an interlayer insulation film 28 to a film thickness of 200 nm. The light shielding film 29 covers the transfer electrode 27 and has an opening above the photoelectric conversion portion 22.

Next, as shown in FIG. 5B, a BPSG film having a predetermined phosphorus concentration and boron concentration is deposited by a normal pressure chemical vapor deposition (CVD) method to a film thickness of about 600 nm on the light shielding film 29. Then, under a reflow at a high temperature of 900° C. or higher, a first flattening film 30 is formed.

Then, as shown in FIG. 5C, a silicon nitride film 36 is formed on the first flattening film 30 by a plasma CVD method to a film thickness of about 1200 nm. For forming a microlens or an interlayer microlens from the above-mentioned refractive-index variable material, a sputtering is performed with (Pb, La) (Zr, Ti) $O_3$ as a target and under the conditions of gas sources and flow rates, Ar: 100 sccm and $O_3$: 10 sccm, to form a PLZT film. An example in which a silicon nitride film is formed will be described below.

As shown in FIG. 5D, a positive resist is applied to the silicon nitride film 36. A patterning is performed to obtain a desirable interlayer lens 31. Then, under a reflow around 160° C., for example, a resist pattern 37 having a lens shape is produced.

Then, as shown in FIG. 5E, the lens shape of the resist pattern 37 is transferred to the silicon nitride film 36 by performing a dry etching with strong anisotropy to form the interlayer lens 31.

In order to improve the condensing rate of the interlayer lens 31, a second flattening film 32 is formed to flatten a surface as shown in FIG. 4. The second flattening film 32 is made of a material having a low refractive index and covers the interlayer lens 31. Then, a color filter 33, a protection film 34 and a microlens 35 are formed to produce a conventional CCD-type solid-state image sensing device.

The above-described methods for forming an interlayer lens have the following problems 1 to 3.

1. The silicon nitride film 36 formed as the interlayer lens 31 is formed by using a normal pressure CVD device, or a plasma CVD device, in general. When the silicon nitride film 36 is formed to have a film thickness of 1000 nm or higher, the film experiences plastic deformation due to film stress. This may cause a crack or removal of the film. Further, a film formation temperature is 200° C. or higher. The uniformity of the film thickness within a plane of a wafer is not high. Thus, there is a bad influence on underlying elements due to a high temperature or a film stress, or the film thickness of the inter layer lens becomes uneven. This causes deterioration of picture quality of the solid-state image sensing device.

2. The refractive index of the interlayer lens 31 formed of the silicon nitride film 36 is about 2.0 at most. For example, when an oxygen content is increased when the film is formed, the compound becomes SiON and the refractive index is reduced to about 1.5. When the size of the video camera is to be reduced, it is necessary to improve the condensing rate (a percentage of the amount of light to enter the photoelectric conversion section from the total incident light) and also to reduce the distance from a surface of the image sensing device to the photoelectric conversion section in order to support a short pupil position lens. In order to achieve this, it becomes necessary to make the microlens, the color filter, and also the interlayer lens thinner. For improving the condensing rate while making the interlayer lens thinner, the refractive index of the interlayer lens has to be increased. If a silicon nitride film is formed with a conventional CVD method, it is extremely difficult to form a transparent film having a refractive index of 2.0 or higher with high uniformity.

3. When a refractive-index variable microlens or an interlayer lens is formed by forming a refractive-index variable material layer made of electrooptic ceramics such as PLZT, $LiNbO_3$ or the like by a sputtering method, it is required to form transparent electrodes above and below the lens and process wiring for voltage application. This causes the problems that the process steps become complicated and the production cost increases. Further, when such a refractive-variable microlens is incorporated into a solid-state image sensing device, the refractive index of the lens can be varied within the range of about 2.2 to 2.6 under the conditions that the transparency is maintained upon voltage application and no mechanical distortion is produced. Therefore, in terms of both the performance and the cost, it is more advantageous to design the thickness, the shape, the refractive index and the like of the microlens or interlayer microlens for every application of the video camera, such that diagonal light can efficiently enter the photoelectric conversion portion when the diaphragm of the lens is opened, so as to conform to design of the video camera to which the solid-state image sensing device will be mounted and produce such a microlens or interlayer microlens, than it is to make the refractive index variable depending on the diaphragm of the camera lens.

SUMMARY OF THE INVENTION

According to one aspect of the present invention, there is provided a semiconductor device comprising a photoelectric conversion portion formed on a semiconductor substrate, a first transparent film provided on the photoelectric conversion portion, and an interlayer lens provided on the first transparent film at a position corresponding to the photoelectric conversion portion, wherein: the interlayer lens has a higher refractive index than the first transparent film, and at least one of upper and lower surfaces of a second transparent film formed with a thin film multilayer structure of two or more types of compounds is formed to have a protruded shape.

In one embodiment of the present invention, the second transparent film includes two or more types of compounds selected from metal compounds and silicon compounds.

According to one aspect of the present invention, there is provided a semiconductor device comprising a photoelectric conversion portion formed on a semiconductor substrate, a first transparent film provided on the photoelectric conversion portion, and an interlayer lens provided on the first transparent film at a position corresponding to the photoelectric conversion portion, wherein: the interlayer lens has a higher refractive index than the first transparent film, and at least one of upper and lower surfaces of a second transparent film formed by a sputtering method is formed to have a protruded shape.

In one embodiment of the present invention, the second transparent film includes one or more types of compounds selected from metal compounds and silicon compounds.

In one embodiment of the present invention, the second transparent film includes two or more types of compounds.

In one embodiment of the present invention, the second transparent film is a thin film multilayer structure of two or more types of compounds.

In one embodiment of the present invention, the second transparent film is a thin film multilayer structure in which titanium oxide layers and silicon nitride layers are alternately laminated.

In one embodiment of the present invention, the second transparent film is a thin film multilayer structure in which titanium oxide layers and silicon oxide layers are alternately laminated.

In one embodiment of the present invention, the first transparent film has a recessed portion on an upper surface due to a recessed portion above the photoelectric conversion portion, and the interlayer is formed with the second transparent film embedded in the recessed portion on the upper surface to form a protrusion on a lower surface of the second transparent film.

In one embodiment of the present invention, a third transparent film having a lower refractive index than the second transparent film is formed on the second transparent film.

In one embodiment of the present invention, a microlens is formed above the third transparent film.

In one embodiment of the present invention, the second transparent film is a thin film multilayer structure in which titanium oxide layers and silicon nitride layers are alternately laminated.

In one embodiment of the present invention, the second transparent film is a thin film multilayer structure in which titanium oxide layers and silicon oxide layers are alternately laminated.

In one embodiment of the present invention, the first transparent film has a recessed portion on an upper surface due to a recessed portion above the photoelectric conversion portion, and the interlayer is formed with the second transparent film embedded in the recessed portion on the upper surface to form a protrusion on a lower surface of the second transparent film.

In one embodiment of the present invention, a third transparent film having a lower refractive index than the second transparent film is formed on the second transparent film.

In one embodiment of the present invention, a microlens is formed above the third transparent film.

According to one aspect of the present invention, there is provided a method for fabricating a semiconductor device comprising the steps of: forming a first transparent film on a semiconductor substrate provided with a photoelectric conversion portion; forming a second transparent film having a higher refractive index than the first transparent film on the first transparent film with a thin film multilayer structure of two or more types of compounds; producing a interlayer lens to form a protrusion on at least one of upper and lower surfaces of the second transparent film on the first transparent film at a position corresponding to the photoelectric conversion portion.

According to one aspect of the present invention, there is provided a method for fabricating a semiconductor device comprising the steps of: forming a first transparent film on a semiconductor substrate provided with a photoelectric conversion portion; forming a second transparent film having a higher refractive index than the first transparent film on the first transparent film by a sputtering method; producing a interlayer lens to form a protrusion on at least one of upper and lower surfaces of the second transparent film on the first transparent film at a position corresponding to the photoelectric conversion portion.

In one embodiment of the present invention, the step of forming the second transparent film forms the second transparent film by sputtering the two or more types of compounds at the same time.

In one embodiment of the present invention, the step of forming the second transparent film forms the second transparent film by sequentially or repeatedly laminating thin films of two or more types of compounds to have a thin film multilayer structure.

Hereinafter, the effects of the present invention caused by the above-described structure will be described.

According to the present invention, at least one of upper and lower surfaces of the second transparent film formed with a thin film multilayer structure of two or more types of compounds is formed to have a protruded shape. This allows the second transparent film formed as the interlayer lens to have a film thickness significantly smaller than 1000 nm. Thus, a crack or removal which may be caused in the film by a film stress can be suppressed. By sequentially laminating two or more types of compound thin films such that the second transparent film has the thin film multilayer structure in the second transparent film, the refractive index of the second transparent film can be arbitrarily changed to a desirable refractive index in accordance with the required performance of the device. It is also possible to improve the condensing rate in the thin film multilayer structure compared to a single layer since reflection at the surface of the interlayer lens can be reduced.

Alternatively, the first transparent film is formed on the semiconductor substrate provided with at least the photoelectric conversion portion, and the second transparent film is formed on the first transparent film by the sputtering method. Then, at least one of the upper and lower surfaces of the second transparent film is formed above the photoelectric conversion portion to have a protrusion in a lens shape to form the interlayer lens.

Compared to a CVD method, the sputtering method can grow a film at a lower temperature and provides the second transparent film having good film thickness uniformity within the plane of a wafer. Thus, bad influences due to high temperature and film stress on the underlying elements, or unevenness in the film thickness of the interlayer lens can be prevented.

The second transparent film may be a thin film having a desired refractive index selected from metal compounds and silicon compounds. Alternatively, by sputtering two or more types at the same time, or alternately laminating two ore more types of compound thin films, the refractive index can be varied. For example, a thin film multilayer structure including titanium oxide layers and silicon nitride layers alternately laminated, or a thin film multilayer structure including titanium oxide layers and silicon oxide layers alternately laminated may be used. Such a thin film multilayer structure can relax the film stress and prevent a crack or removal. The thin film multilayer structure also improves the condensing rate compared to the single layer structure by reducing the reflection at the interlayer lens surface. Compared to the CVD method, the sputtering method has a good controllability of the film thickness. Thus, a thin film multilayer structure can be produced with a high controllability.

The protrusion of the interlayer lens may be processed on the upper surface of the second transparent film with etching or the like to protrude upward. Alternatively, the protrusion of the interlayer lens may be formed on the lower surface of the second transparent film to protrude downward by the upper surface recessed portion due to the protrusions and recessed portions under the first transparent film.

By providing the third transparent film having a lower refractive index than that of the second transparent film on the second transparent film, the surface can be flattened. By forming the microlens above the second transparent film, the condensing efficiency can be further improved.

According to the present invention, at least one of the upper and lower surfaces of the second transparent film formed with the thin film multilayer structure of two or more types of compounds is formed to have a protruded shape, or the second transparent film is formed by a sputtering method with a protrusion provided above the photoelectric conversion portion on at least one of the upper and lower surfaces of the second transparent film, to form the interlayer lens.

Thus, the invention described herein makes possible the advantages of providing a semiconductor device such as a solid-state image sensing device in which a desirable refractive index can be designed in accordance with a required performance of the device without causing a crack or removal of the interlayer lens, and which has an highly uniform interlayer lens having the desirable refractive index as well as a high quality and a high performance, and a method for fabricating the same.

These and other advantages of the present invention will become apparent to those skilled in the art upon reading and understanding the following detailed description with reference to the accompanying figures.

BRIEF DESCRIPTION OF THE DRAWINGS

FIG. 1 is a cross-sectional view showing a structure of one pixel of a CCD solid-state imaging device which is one embodiment of the semiconductor device of the present invention.

DESCRIPTION OF THE PREFERRED EMBODIMENTS

Figure 2A:
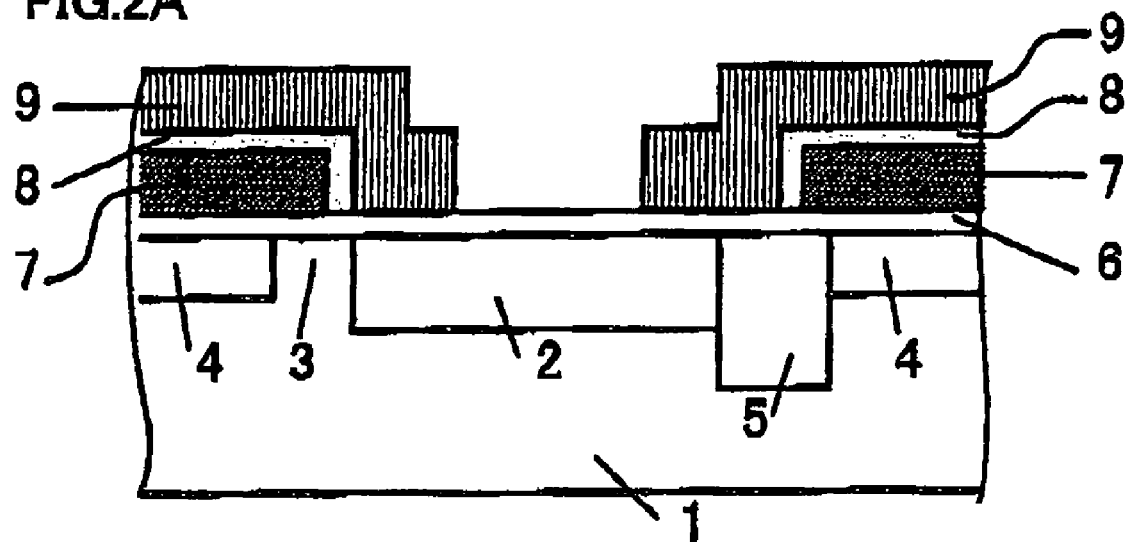
FIGS. 2A to 2F are cross sectional views showing a fabrication process of the CCD solid-state imaging device of FIG. 1.

Hereinafter, embodiments of a semiconductor device and a fabrication method thereof according to the present invention will be described. In the descriptions below, the embodiments of the present invention are embodied as a solid-state image sensing device and a fabrication method thereof. The semiconductor device according to the present invention includes not only a so-called solid-state image sensing device, for example, a CCD image sensor, a CMOS image sensor, a CMD, a charge injection device, a bipolar image sensor, a photoconductive film image sensor, a laminate type CCD image sensor, an infrared image sensor, but also any device which may be used as a light receiving portion or a light emitting portion in various apparatus, for example, a light receiving device produced in a fabrication process for a semiconductor integrated circuit, a light emitting device such as a light emitting diode, a light transmittance control device such as a liquid crystal panel, and the like.

In a semiconductor device according to the present invention, a first transparent film is formed on a semiconductor substrate. At least a photoelectric conversion portion is provided on the semiconductor substrate. A second transparent film is formed on the first transparent film by a sputtering method. The second transparent film has a higher refractive index compared to the first transparent film. A protrusion is formed on at least one of upper and lower surfaces of the second transparent film above the photoelectric conversion portion. An interlayer lens is formed as such.

The semiconductor substrate is a substrate which is usually used for producing a semiconductor device and is not particularly limited. For example, a substrate formed of a semiconductor such as silicon, germanium, compound semiconductor such as SiC, GaAs, AlGaAs, and the like can be used. Particularly, a silicon substrate is preferable. The semiconductor substrate is usually doped with n-type or p-type impurities. The semiconductor substrate may further include one or more n-type or p-type well regions.

On the semiconductor substrate surface, regions containing n-type or p-type impurities at a high concentration may be formed as a charge transfer region, separation region, contact region, channel stopper region and the like, beside the photoelectric conversion portion (light emitting portion or light receiving portion). Furthermore, another semiconductor device or circuit may be combined.

The photo electric conversion portion may be a light receiving portion or a light emitting portion. Examples of the light receiving portion include a pn-junction diode formed on the semiconductor substrate surface. Regarding the pn-junction diode, the size, shape, the number of p-type or n-type impurity layers formed on the semiconductor substrate surface, and impurity concentrations of the impurity layers can be appropriately set in accordance with the required performance of the semiconductor device.

Examples of the light emitting portion include a light emitting diode. The photoelectric conversion section can be formed on the semiconductor substrate surface by known methods. Examples of such known methods include a method for forming a photo mask having an opening at a desired region of the semiconductor substrate by a photolithography or etching process, and injecting ions into the semiconductor substrate by using the photo mask.

For example, in a CCD, a transfer electrode is usually formed on the semiconductor substrate between the photoelectric conversion portions via an insulation film. A light shielding film is formed on the transfer electrode via the interlayer insulation film. The transfer electrode can be made of any material which may be used as an electrode, for example, amorphous silicon and tungsten silicide, and the like. The film thickness of the transfer electrode is not particularly limited and maybe about 300 to 600 nm, for example. The film thickness of the light shielding film is not particularly limited as long as the light shielding film is formed of a material having a thickness so as to block the visible light and infrared light substantially completely. Examples of such a film include a film formed of a metal film, alloy film and the like, i.e. tungsten silicide, titanium tungsten, having the film thickness of about 100 to 1000 nm. The insulation film and the interlayer insulation film maybe made of any material which is usually used. Examples of such a film includes: a single layer film of a plasma tetra-ethoxy silane (TEOS) film, low temperature oxide (LTO) film, high temperature oxide (HTO) film, non-doped silicate glass (NSG) film formed by a CVD method, a spin on glass (SOG) film applied and formed by a spin coat method, or a silicon nitride film formed by a CVD method; and a laminated film of a plurality of these films. The thicknesses of the insulation film, interlayer insulation film, transparent electrode, and a light shielding film may be one of the factors which define the thickness and the shape of the protrusion when the protrusion of the interlayer lens formed thereon protrudes downward. Thus, it is preferable that the total film thickness is adjusted to about 500 to 2000 nm in view of a thickness, a material and the like of the first transparent film which will be described later.

The first transparent film may have a recessed portion in an upper surface above the photoelectric conversion section due to a protrusion or recessed portion which exists below the film such as a transfer electrode, a light shielding film and the like. The upper surface does not necessarily have a recessed portion and the surface may be flat. It is preferable that the first transparent film has a light transmittance of about 80 to 100% depending on the material and the film thickness. The material of the first transparent film may be a single layer film or a laminated layer film mentioned above as the insulation film. Particularly, BPSG is preferable. The film thickness may be, for example, about 100 to 2000 nm. It is preferable that a shape and a depth of the recessed portion on the upper surface of the first transparent film are appropriately adjusted because they may be one of the factors which define the thickness and the shape of the protrusion when the protrusion of the interlayer lens formed thereon protrudes downward.

The insulation film, the interlayer insulation film, the transfer electrode, the light shielding film and the first transparent film can be formed by appropriately selected known methods in the art, for example, various CVD methods such as sputtering method, reduced pressure CVD method, normal CVD method, and plasma CVD method, a pin coat method, vacuum deposition method, EB method and the like.

The second transparent film is formed by a sputtering method. When the first transparent film has a recessed portion on the upper surface above the photoelectric conversion portion due to a protrusion or recessed portion under the film, a protrusion is formed on a lower surface of the second transparent film and an inter layer protruding downward is formed. Optionally, an upper surface of the second transparent film may be processed and a protrusion may be formed by, for example, a dry etching method to form an inter layer lens protruding upward. The second transparent film may have the protrusions on both the upper surface and the lower surface.

The second transparent film should have a higher refractive index than the first transparent film. The second transparent film may be a metal compound or a silicon compound, such as, $TiO_2$ (refractive index: 2.2), $TaO_2$ (refractive index: 2.2), $ZrO_2$ (refractive index: 2.2), $ITO[In_2O_3\text{-}SnO_2]$ (refractive index: 2.1), $IZO[In_2O_3\text{-}ZnO_2]$ (refractive index: 2.0), $Sb_2O_3$ (refractive index: 2.2), PZT $(PbZr_{0.5}Ti_{0.5}O_3)$ (refractive index: 2.6), $SrTiO_3$ (refractive index: 2.4), $Al_2O_3$ (refractive index: 1.7), $Si_3N_4$ (refractive index: 2.0), SiON (refractive index: 1.8), $SiO_2$ (refractive index: 1.5) and the like. A thin film may be formed of one of these metal compounds and silicon compounds which has a desired refractive index. Alternatively, two or more compounds may be sputtered at the same time or laminated alternately to form a thin film multilayer structure. This allows alternating the refractive index and also relaxing the film stress to prevent a crack or removal of the interlayer lens. Further, the reflection at the surface of the interlayer lens having the thin film multilayer structure can be reduced to that of the interlayer lens formed of a single layer film, and the condensing rate can be improved. In order to implement such a thin film multilayer structure, high controllability of the film thickness is required. This is difficult to be achieved by the conventional CVD method, but can be implemented by a sputtering method.

The second transparent film may be formed as a single layer film of $TiO_2$ (refractive index: 2.5) or $SiO_2$ (refractive index: 1.5) by a sputtering method. Alternatively, the second transparent film may be formed having a film thickness of 900 nm and a refractive index of 2.1 by alternately laminating five layers (film thickness 90 nm) of $TiO_2$ (refractive index: 2.5) and five layers (film thickness 90 nm) of $SiO_2$ (refractive index: 1.5). When such a thin film multilayer structure is formed with an 8-inch wafer, uniformity in a plane is within the range of 900 nm±10 nm. A variance is about one fifth that when the normal CVD method is used. Further, by alternately laminating five layers of $Si_3N_4$ (refractive index: 2.0) and five layers of $SiO_2$ (refractive index: 1.5), a transparent film having the refractive index of 1.8 may be formed.

Further, a third transparent film made of a transparent material having a low refractive index may be formed on the interlayer lens formed of the second transparent film so as to cover the surface of the interlayer lens with a uniform film thickness. The material of the third transparent film may have a refractive index lower than that of a high refractive index material forming the second transparent film by 0.5 or more. The third transparent film may be formed as a single layer film or a laminated layer film by the sputtering method or a CVD method. The third transparent film maybe an organic resin, for example, one having a refractive index in the visible range smaller than about 1.6, specifically, a fluoroolefin copolymer, a polymer having aliphatic ring structure containing fluorine, a perfluoroalkylether copolymer, mixture of one or more types of (meta)acrylate polymer containing fluorine, and the like. Further, fluoride, more specifically, magnesium fluoride ($MgF_2$) may be added to these polymers.

It is also preferable to form a microlens above the interlayer lens via the third transparent film. One or more types of films which serve as a color filter, a passivation film, protection film, flattening film, interlayer film or the like may be formed of any material with any film thickness between the third transparent film and the microlens. The microlens may be formed of any known material by any known method in the art (see Japanese Publication for Opposition No. 2945440). It is preferable that a shape of the microlens is processed to be an arch shape with a flattened bottom surface and a protruded upper surface by the third transparent film, passivation film, protection film, flattening film, interlayer film, or the like.

Hereinafter, Embodiment 1 of the semiconductor device and the fabrication method thereof according to the present invention will be specifically described with reference to the drawings. The semiconductor device in the descriptions below is a CCD solid-state imaging device. The materials and device mentioned in the description below may be the materials and the devices used in a normal fabrication process for a semiconductor device. The detailed descriptions of the materials and the devices are omitted herein.

FIG. 1 is a cross-sectional view illustrating the structure of Embodiment 1 in a CCD solid-state imaging device according to the present invention. Although the CCD solid-state imaging device has one or more pixels, FIG. 1 shows only one pixel for the sake of clarity.

As shown in FIG. 1, a CCD solid-state imaging device 20 as a semiconductor device includes a plurality of photoelectric conversion portions 2, read out gate portions 3, CCD transfer channels 4 and channel stoppers 5 on a surface of a semiconductor substrate 1. Transfer electrodes 7 are provided above the CCD transfer channels 4 with an insulation film 6 interposed therebetween.

The photoelectric conversion portions 2 may be a plurality of pn-junction diodes formed in a matrix on a surface of the semiconductor substrate 1. Light which enters the photoelectric conversion portions 2 are converted into signal charges. The signal charges converted in the photoelectric conversion portions 2 are supplied to the CCD transfer channels 4 provided on one side (left side in FIG. 1) of the respective photoelectric conversion portions 2 through the respective read out gate portions 3. Then, the signal charges are transferred to charge detection portions (not shown) and detected. The signal charges are not supplied to the CCD transfer channels 4 on the other side (right side in FIG. 1) of the respective photoelectric conversion portions 2 since the channel stoppers 5 are provided therebetween.

A light shielding film 9 is provided above the transfer electrodes 7 with an interlayer insulation film 8 interposed therebetween. The light shielding film 9 is provided for preventing the leakage of light to the transfer portions (CCD transfer channels 4). Ends of the photoelectric conversion portions 2 are covered with the light shielding film 9. The parts of photoelectric conversion portions 2 other than the ends are optically opened upward.

A first flattening film 10 formed of BPSG is laminated on the light shielding film 9 as a first transparent film. An interlayer lens 11 formed of a second transparent film having a high refractive index is formed on the first flattening film 10 so as to be positioned above each of the photoelectric conversion portions 2.

The interlayer lens 11 is provided for condensing light to the respective photoelectric conversion portions 2. An upper surface thereof is formed to be protruded upward. A second flattening film 12 for flattening a surface is provided as a third transparent film so as to cover the interlayer lens 11. A color filter 13 which is a combination of red, green, and blue is formed on the second flattening film 12. A microlens 15 is provided above the color filter 13 with a protection film 14 formed of a transparent organic film interposed therebetween so as to be positioned above the each of the photoelectric conversion portions 2 and the corresponding interlayer lens 11.

The CCD solid-state imaging device 20 having the above-described structure may be fabricated as follows.

First, as shown in FIG. 2A, predetermined impurity ions are injected into the semiconductor substrate 1 to form the photoelectric conversion portion (light receiving portion) 2, the read out gate portion 3, the CCD transfer channel (transfer portion) 4, and the channel stopper 5.

Then, the insulation film 6 is formed on a surface of the semiconductor substrate 1 by a thermal oxidation, for example. A transfer electrode 7 having a predetermined pattern which is formed of polysilicon is formed on the insulation film 6. The light shielding film 9 is formed above the transfer electrode 7 with the interlayer insulation film 8 interposed therebetween. The light shielding film 9 covers the transfer electrode 7 and has an opening above the respective photoelectric conversion portions 2.

Figure 2B:
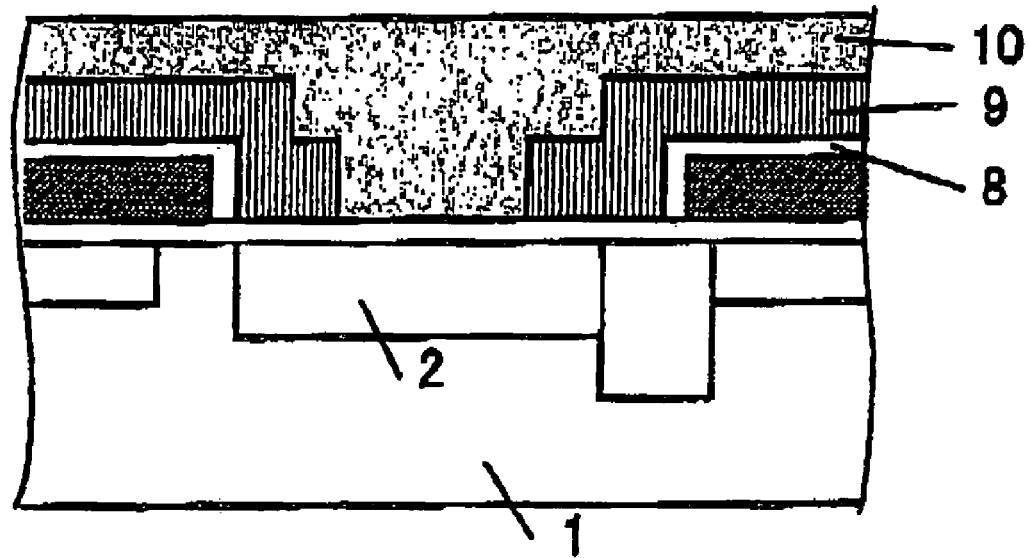

Next, as shown in FIG. 2B, a BPSG film is deposited by a normal pressure CVD method to a film thickness of 900 nm so as to cover the light shielding film 9. The phosphorous and boron concentrations included in the BPSG film and the subsequent reflow temperature may be adjusted such that a surface becomes flat or has a recessed portion above the photoelectric conversion portion 2. In the present embodiment, the phosphorous concentration is set to be 4.2 wt % and the boron concentration is set to be 3.8 wt %. Then, under a reflow at 950° C. for 20 minutes, the first flattening film 10 is formed.

Figure 2C:
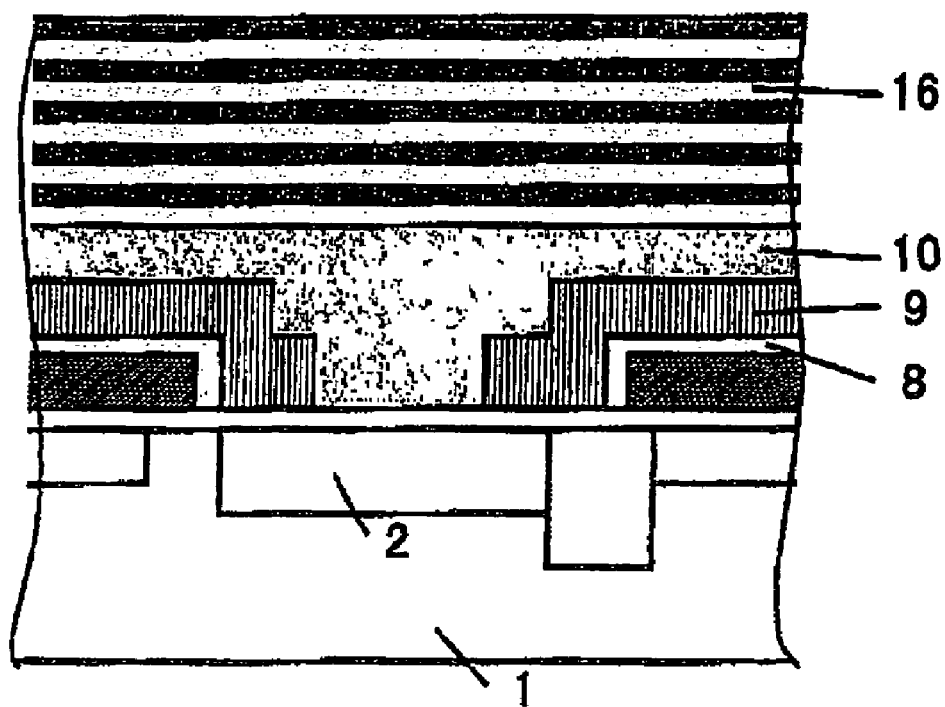

Then, as shown in FIG. 2C, by using Si and Ti as targets under the stream of $O_2$ and Ar, 90 nm of a $SiO_2$ film and $TiO_2$ film are alternately formed by a sputtering method on the first flattening film 10. Thus, a transparent film having a high refractive index (second transparent film 16) which has the total film thickness of 900 nm and the refractive index of 2.1 is formed. In the present embodiment, two types of films are sputtered alternately. However, a single layer of $TiO_2$ may be used, and $TiO_2$ and $TaO_2$ may be sputtered at the same time.

Figure 2D:
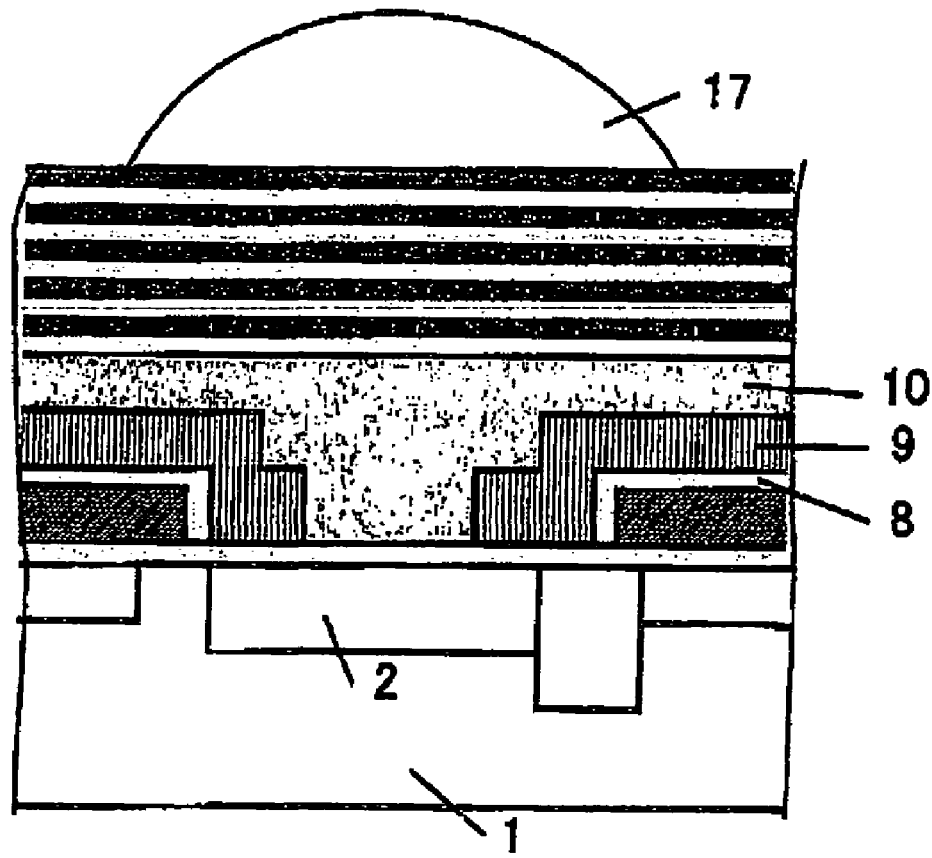

As shown in FIG. 2D, a positive photoresist is applied to the high refractive index film 16 as in the conventional art. A patterning is performed into a desirable pattern. Then, under a reflow around 160° C., for example, a resist pattern 17 having a lens shape is produced.

Figure 2E:
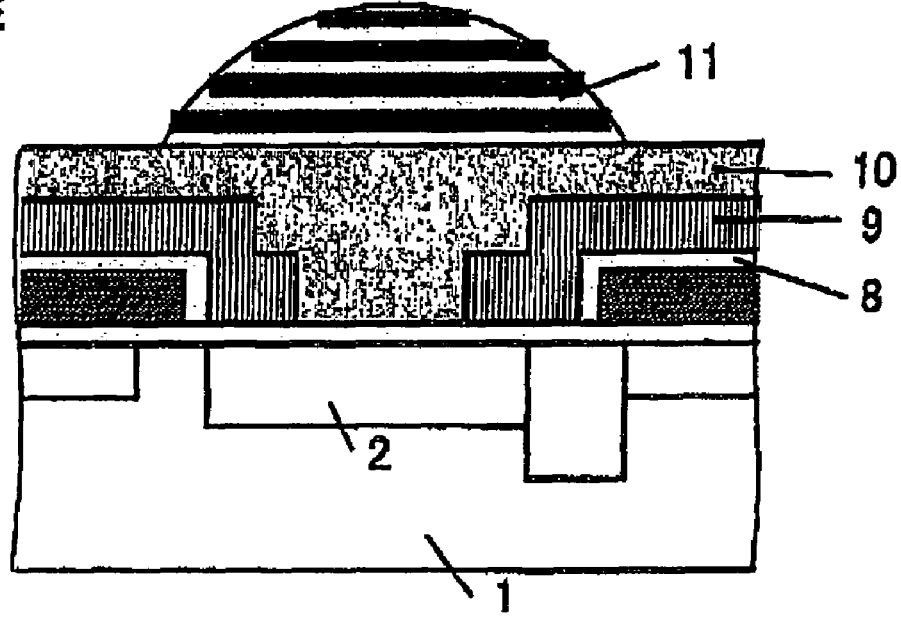
Figure 2F:
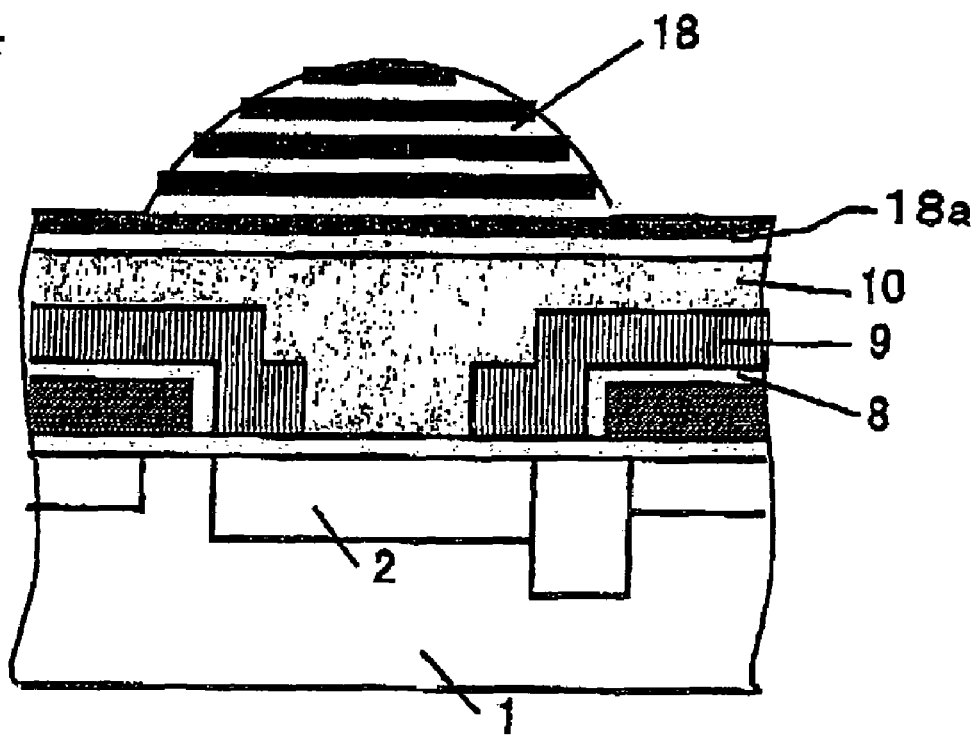

Then, as shown in FIG. 2E, the lens shape of the resist pattern 17 is transferred to the high refractive index film 16 by performing a dry etching with strong anisotropy to form the interlayer lens 11. In the present embodiment, dry etching is performed until the underlying first flattening film 10 is exposed except for the portions above the photoelectric conversion portions 2. However, as shown in FIG. 2F, dry etching may be stopped so as to left a flattened portion 18a on the first flattening film 10 and to form the interlayer lens 18.

In order to improve the condensing rate of the interlayer lens 11, a second flattening film 12 is formed to flatten a surface. The second flattening film 12 has a low refractive index and covers the interlayer lens 11. Then, a negative resist in which pigments having spectroscopic properties of green, red, and blue dispersed therein is applied, exposed, and developed by a photolithography technique to process a desirable pattern. Thus, the color filter 13 is formed. The protection film 14 is formed on the color filter 13 by applying an acryl resin (for example, a thermosetting acryl resin Optomer SS-1151 (JSR Corporation)) to have a thickness of 0.7 μm. Then, the microlens 15 is formed by using a known technique (for example, methods described in Japanese Publication for Opposition No. 2945440). Thus, the CCD solid-state imaging device shown in FIG. 1 can be produced.

According to the present invention, the first transparent film 10 is formed on the semiconductor substrate 1 provided with the photoelectric conversion portion 2, and the second transparent film having a refractive index higher than the first transparent film 10 is formed thereon by a sputtering method.

Then, a protrusion is formed above the photoelectric conversion portion 2 on at least one of the upper and lower surfaces of the second transparent film to form the interlayer lens 11. In this case, the second transparent film may be a thin film which has a desired refractive index selected from metal compounds and silicon compounds. The refractive index can be varied by sputtering two or more types of compounds at the same time, or by alternately laminating two or more types of compounds to obtain the thin film multilayer structure. A desired refractive index can be designed in accordance with the required property of the device without causing a crack or removal of the interlayer lens and a highly uniform interlayer lens having a high quality and a high performance can be provided.

Figure 3:
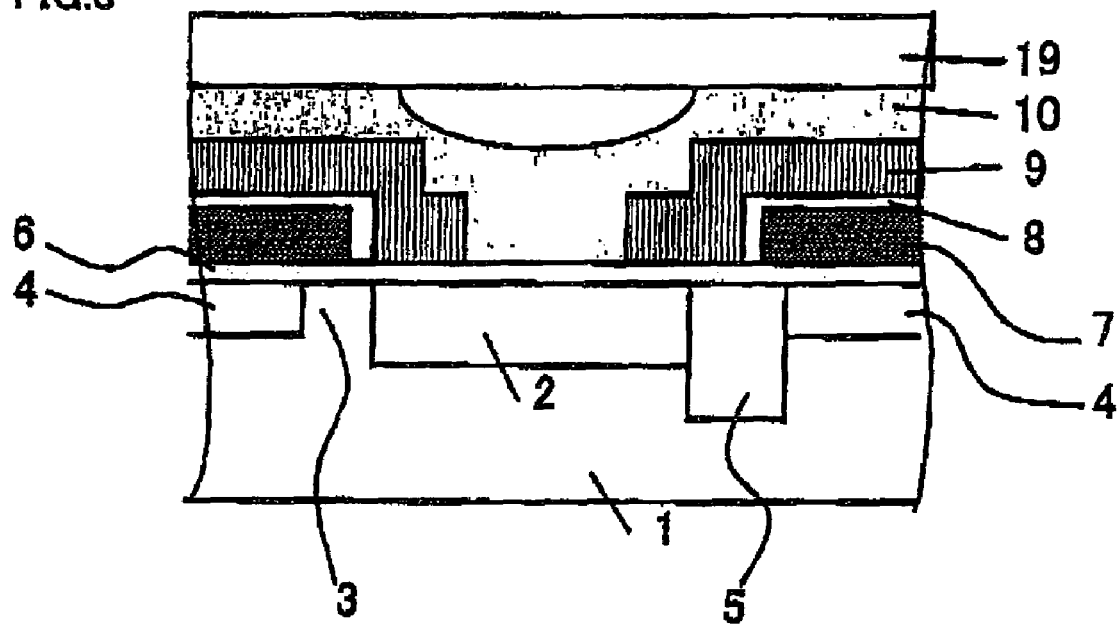
FIG. 3 is a cross-sectional view showing a structure of one pixel of a CCD solid-state imaging device which is another embodiment of the semiconductor device of the present invention.
Figure 4:
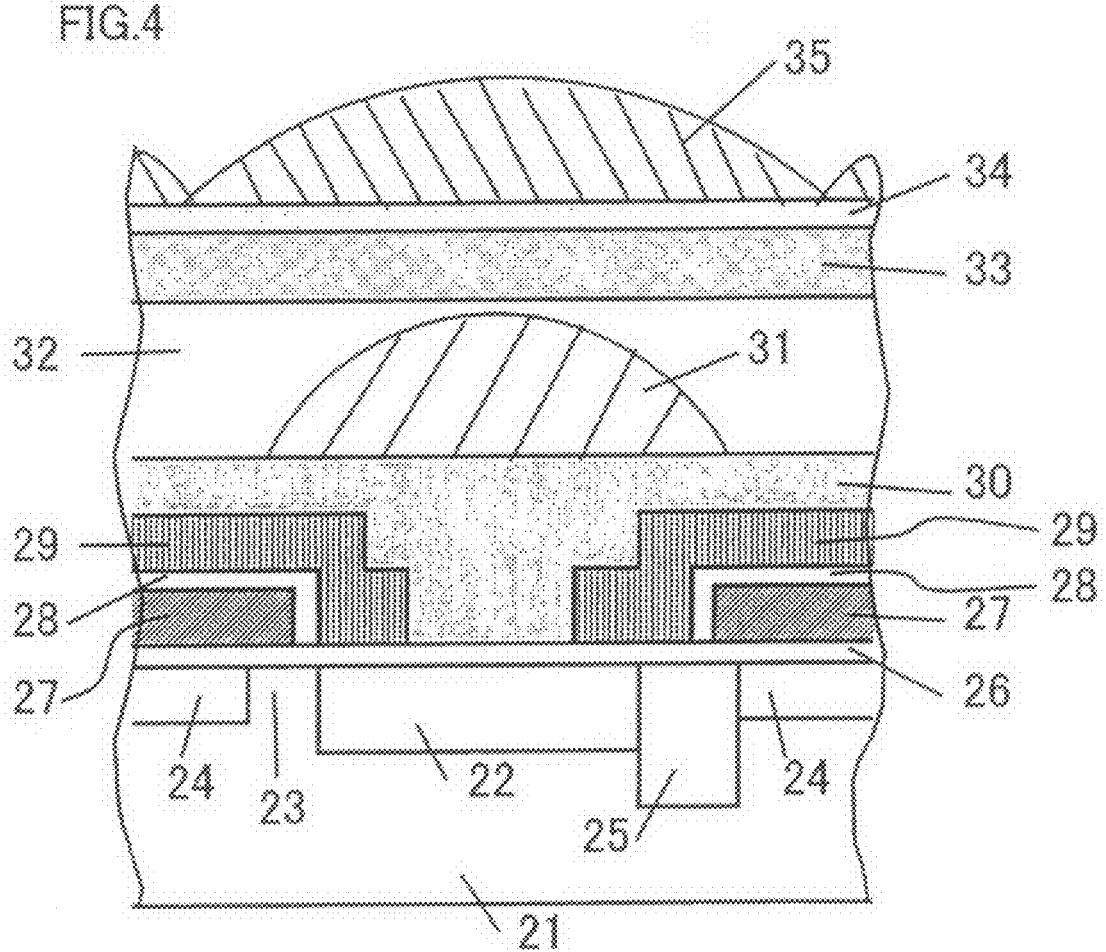
FIG. 4 is a cross-sectional view showing a structure of one pixel of a conventional CCD solid-state imaging device.
Figure 5A:
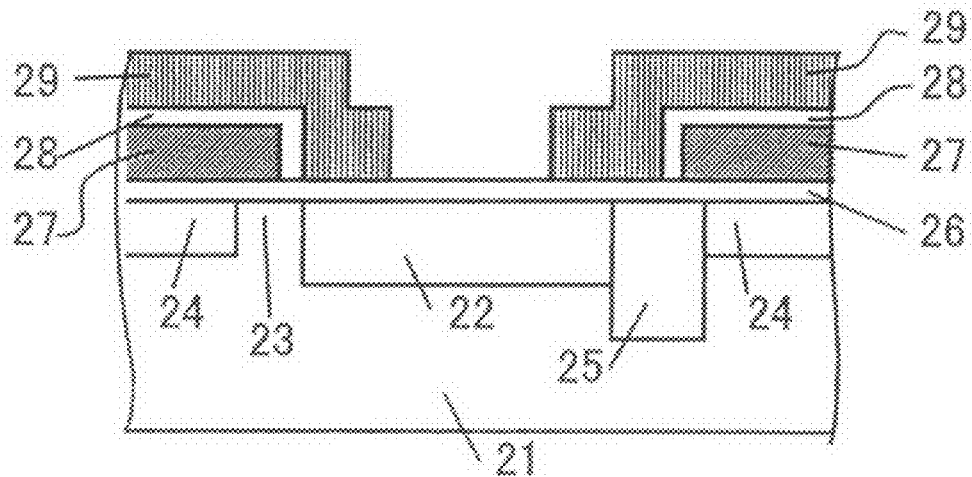
FIGS. 5A to 5E are cross sectional views showing a fabrication process of a conventional CCD solid-state imaging device.
Figure 5B:
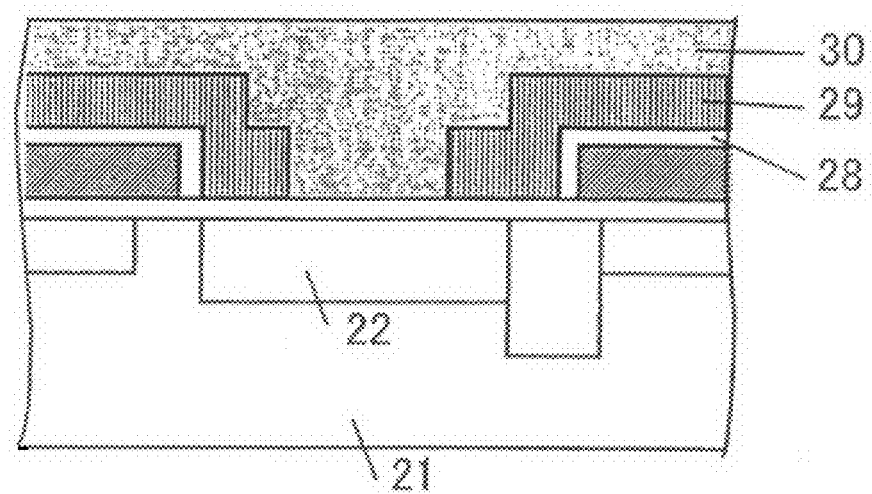
Figure 5C:
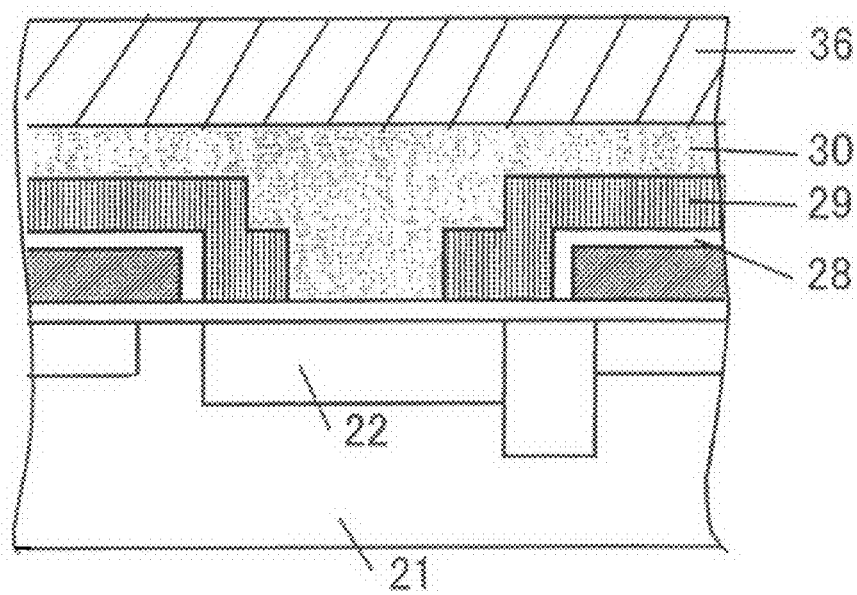
Figure 5D:
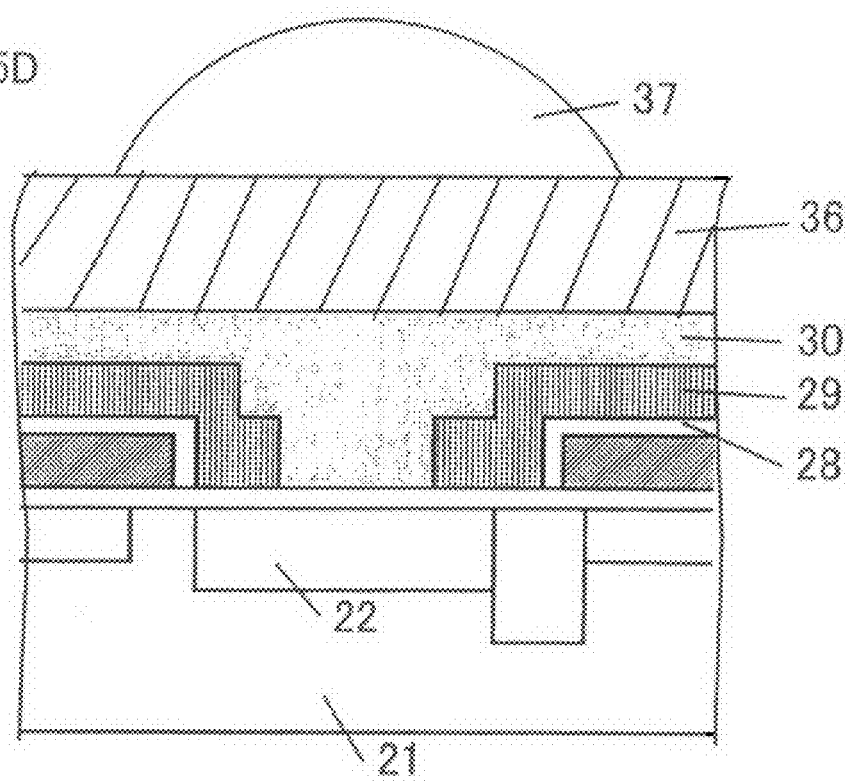
Figure 5E:
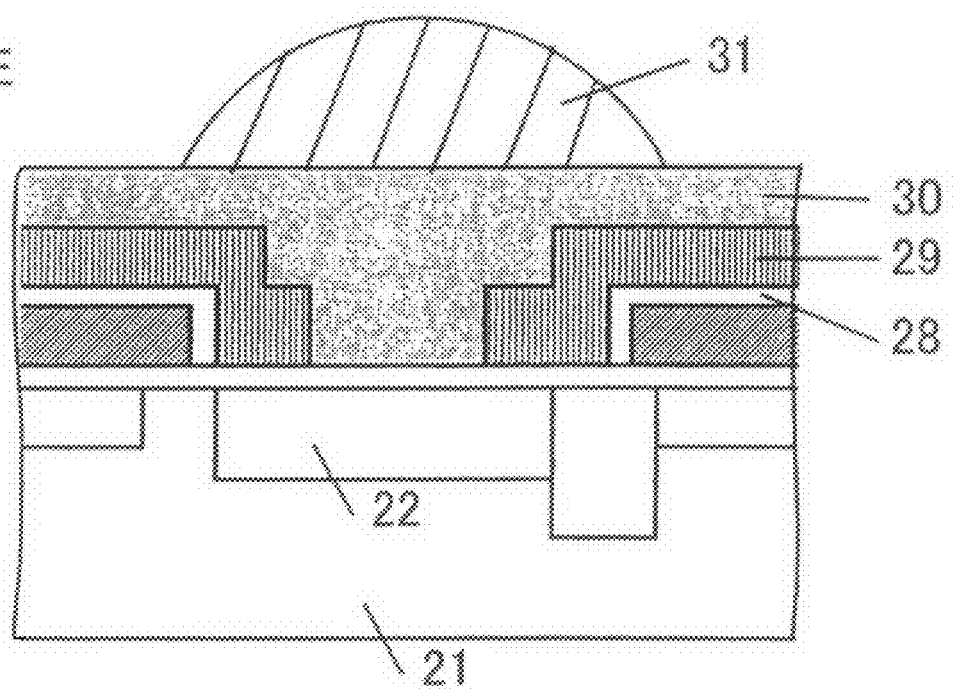

As described above, as shown in FIG. 1, the upper surface of the first flattening film (first transparent film) 10 may be flattened and the upper surface of the high refractive index transparent film (second transparent film) 16 may be processed to form the inner lens protruding upward. Alternately, as shown in FIG. 3, the upper surface of the first flattening film 10 may be formed to have a recessed portion above the photoelectric conversion portion 2 such that a protrusion is formed on the lower surface of the high refractive index transparent film 16 to form an interlayer lens 19 protruded downward.

In the above embodiment, the present invention is applied to a CCD solid-state imaging device. However, the present invention can be applied to other devices, for example, other types of solid-state imaging devices such as a MOS-type solid-state imaging device, a liquid crystal display device, a light receiving device and a light emitting device (the photoelectric conversion portion includes an opto-electric conversion portion and an electro-optic conversion portion). When the present invention is applied to these devices, a semiconductor device having a lens of the desired shape can be obtained by appropriately adjusting the thickness and formation conditions and the like of the interlayer lens, the flattening films, the protection film, and the microlens.

The present invention has been described above with reference to the preferable embodiment. However, the present invention should not be construed as being limited to this embodiment. It should be recognized that the scope of the present invention is only construed by the claims. It should be recognized that those skilled in the art can implement the equivalent scope from the descriptions of the specific preferable embodiment, based on the descriptions of the present invention and common technical knowledge. It is also recognized that the patents, patent applications and documents referred herein are hereby incorporated by reference as if their entirety are described herein.

In the field of the semiconductor device such as a solid-state imaging device having an interlayer lens and the method for fabricating the same, by forming a first transparent film on a semiconductor substrate provided with at least a photoelectric conversion portion, forming a second transparent film having a higher refractive index than that of the first transparent film by a sputtering method, and forming a protrusion above the photoelectric conversion portion on at least one of upper and lower surfaces of the second transparent film to form a interlayer lens, a refractive index can be designed in accordance with the required property of a device without causing a crack or removal of the interlayer lens, and a highly uniform interlayer lens having a desired refractive index and high quality and high performance can be obtained.

A solid imaging device according to the present invention can improve the light receiving sensitivity even though the pixel size is reduced since there are demands for reducing the size of the solid-state imaging device, increasing the number of pixels, as well as reducing the cost. The present invention can be applied to a wide variety of applications, such as, a digital camera, a video camera, a mobile telephone with the integrated camera, a scanner, a digital copier, a facsimile, and the like, and can improve the performance and can also reduce the size and the cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising a photoelectric conversion portion formed on a semiconductor substrate, a first transparent film provided on the photoelectric conversion portion, and an interlayer lens provided on the first transparent film at a position corresponding to the photoelectric conversion portion, wherein:

the interlayer lens has a higher refractive index than the first transparent film, and is a thin transparent film multilayer structure formed of two or more types of compounds, and at least one of upper and lower surfaces of transparent film said thin transparent film multilayer structure has a protruded shape.

2. A semiconductor device according to claim 1, wherein said thin transparent film multilayer structure includes two or more types of compounds selected from metal compounds and silicon compounds.

3. A semiconductor device according to claim 1, wherein said thin transparent film multilayer structure includes titanium oxide layers and silicon nitride layers alternately laminated.

4. A semiconductor device according to claim 2, wherein said thin transparent film multilayer structure includes titanium oxide layers and silicon oxide layers alternately laminated.

5. A semiconductor device according to claim 1, wherein the first transparent film has a recessed portion on an upper surface due to a recessed portion above the photoelectric conversion portion, and the interlayer lens is formed with said thin transparent film multilayer structure embedded in the recessed portion on the upper surface to form a protrusion on a lower surface of said thin transparent film multilayer structure.

6. A semiconductor device according to claim 1, wherein a third transparent film having a lower refractive index than the thin transparent film multilayer structure is formed on the transparent film multilayer structure.

7. A semiconductor device according to claim 6, wherein a microlens is formed above the third transparent film.

\* \* \* \* \*